United States Patent [19]

Epworth et al.

[11] Patent Number: 5,619,603
[45] Date of Patent: Apr. 8, 1997

[54] METHOD OF CREATING BRAGG GRATINGS IN WAVEGUIDES

[75] Inventors: Richard E. Epworth, Sawbridgeworth; Terry Bricheno, Great Sampford, both of United Kingdom

[73] Assignee: Northern Telecom Limited, Montreal, Canada

[21] Appl. No.: 447,803

[22] Filed: May 23, 1995

[30] Foreign Application Priority Data

May 26, 1994 [GB] United Kingdom ............... 9410545

[51] Int. Cl.⁶ ........................................... G02B 6/34
[52] U.S. Cl. ........................................... 385/37
[58] Field of Search ............................ 385/37, 123, 10; 359/566, 569, 573, 900

[56] References Cited

U.S. PATENT DOCUMENTS

| | | | |
|---|---|---|---|
| 5,066,133 | 11/1991 | Brienza | 385/37 X |
| 5,104,209 | 4/1992 | Hill et al. | 385/37 X |
| 5,307,437 | 4/1994 | Facq et al. | 385/37 X |
| 5,313,538 | 5/1994 | Sansonetti | 385/28 |
| 5,327,515 | 7/1994 | Anderson et al. | 385/123 |
| 5,351,321 | 9/1994 | Snitzer et al. | 385/37 X |
| 5,367,588 | 11/1994 | Hill et al. | 385/37 |

OTHER PUBLICATIONS

Hill et al, "Bragg gratings fabricated in monomode photosensitive optical fibre by UV exposure through a phase mask", Applied Physics Letters, vol. 62, No. 10, Mar. 8, 1993, pp. 1035–1037.

*Primary Examiner*—Rodney B. Bovernick
*Assistant Examiner*—Hemang Sanghavi
*Attorney, Agent, or Firm*—Lee, Mann, Smith, McWilliams, Sweeney & Ohlson

[57] ABSTRACT

During the photo-induced creation of a Bragg grating in a photosensitive optical fibre using the interference fringe pattern generated in the near field of a phase grating, the spacing between fibre and phase grating is modulated.

10 Claims, 8 Drawing Sheets

5,619,603

METHOD OF CREATING BRAGG GRATINGS IN WAVEGUIDES

BACKGROUND OF THE INVENTION

Bragg gratings can be created in a suitably photoresponsive optical waveguide by illuminating it with an interference fringe pattern of appropriate pitch generated in ultraviolet light of a suitable wavelength, typically in the region of about 200 nm. A first order Bragg grating in such a waveguide may typically have a pitch of about 1.0 µm.

One technique by which such an interference fringe pattern can be generated is to arrange for two coherent beams of collimated ultra-violet light to intersect each other at an appropriate angle. The wavefronts of these two beams are respectively schematically represented in FIG. 1 by the sets of parallel lines 10 and 11. Their interference sets up a fringe pattern in which an optical fibre 12 is placed. The resolved component of the pitch of the fringes, measured along the axis of the fibre, depends upon the wavelength of the light being employed, the angle at which the two beams intersect, and the angle between the fibre axis and the resulting fringe pattern.

The spectral selectivity of a Bragg grating depends in part upon the length of that grating. The production of long interference patterns in the manner described with reference to FIG. 1 requires the use of correspondingly wide beams, which in its turn imposes increased constraints upon the coherence length of the light emitted by the source employed to generate these beams, and upon the optical quality of the associated optical system. Alternatively, narrower beams of shorter coherence length could be employed together with some mechanical 'step-and-repeat' arrangement to step the position of the interference pattern with respect to the waveguide in which the Bragg grating is being created. However this alternative approach is seen to suffer from the disadvantage of requiring mechanical translation stages of <100 nm absolute precision over the required length of the Bragg grating.

A different approach to the generation of the interference fringes is to employ a diffraction grating, and to locate the waveguide in close proximity to its diffracting elements. This arrangement is for instance described in a paper by D M Tennant et al. entitled; 'Characterization of near-field holography grating masks for optoelectronics fabricated by electron beam lithography', J Vac. Sci. Technol. B, Vol. 10, No. 6, pp 2530-5 (Dec 1992). That paper is particularly concerned with using an e-beam written phase grating etched into fused silica substrate as the diffraction grating, and the design of the phase mask was such that, when it was illuminated with ultra-violet light at 364 nm at the appropriate angle of incidence, only the zero order and first order diffracted beams propagated in the region of space beyond the phase mask. The (near-field) interference between these two beams was then used to write a photolithographic mask on an InP substrate for subsequent etching to produce the DFB grating structure of a DFB laser. When this general approach is attempted for the direct writing of Bragg gratings in photosensitive glass waveguides, a crucial difference is encountered that is attributable to the much lower refractive index of glass than InP. This means that the required pitch of the Bragg grating in the glass is much greater than in the InP, typically 1.08 µm as opposed to 0.24 µm. In the case of the writing of the fringe pattern in a photoresist layer on InP, the wavelength of the writing beam, at 364 nm, was longer than the pitch of the fringe pattern, which lay in the range 235 to 250 nm, and hence the non-evanescent propagation of a second order diffracted beam beyond the phase grating does not occur. However in the case of the writing of a fringe pattern having a pitch of about 1 µm using a writing beam with a wavelength of about 240 nm, non-evanescent propagation of at least second and third order diffracted beams beyond the phase grating is not automatically suppressed, but is very liable to occur unless the profile of the diffracting elements is specifically designed to suppress any of these higher order diffracted beams.

FIG. 2 illustrates the situation in respect of a short phase grating of pitch 1.08 µm, 1:1 mark space ratio and phase π, that is illuminated at normal incidence with light of 244 nm wavelength. The phase step π suppresses the zero order beam, but the first, second, and third order beams are propagated. The near field intensity is plotted in 5 µm steps from 5 µm out to 300 µm from the phase grating. It is seen that the near field interference is no longer the simple fringes resulting from two-beam interference, but has a more complicated structure.

For FIG. 2 it was chosen to exemplify the near field intensity pattern in respect of a short grating only 40 periods long so that the separation of the different diffraction orders is more readily apparent. Normally the grating would be much longer than this, with the result that the different orders remain substantially totally overlapped out to a much greater distance from the grating. This is the situation exemplified in the near field intensity patterns plotted in FIG. 3. The illumination conditions for FIG. 3 are the same as those for FIG. 2, and the sole difference between the gratings is that the FIG. 3 grating is 1000 periods long instead of only 40. In FIG. 3 the intensity profile is plotted in 2 µm steps from 40 µm out to 200 µm from the grating. FIG. 3 shows that if the waveguide core were spaced from the grating at an optical path distance equivalent to 70 µm in air, then the resulting photo-induced Bragg grating would have the same principal periodicity as that of the phase grating, whereas if the spacing were at an optical path distance equivalent to 95 µm in air, then the resulting photo-induced Bragg grating would have its principal periodicity equal to half that of the phase grating.

The situation is even more confused if imperfections in the phase grating are taken into account. FIG. 4 is a replot of the intensity profiles of FIG. 3 with the sole difference that the FIG. 4 phase grating has a 10% error in mask height, thus corresponding to a phase step of 0.9π instead of π. Similarly FIG. 5 is a replot of the intensity profiles of FIG. 3 with the sole difference that the FIG. 5 phase grating has a mark space ratio error, being 9:7 instead of 1:1. It is seen that in both instances the errors give rise to intensity variations of high spatial frequency in the near field in the direction normal to the plane of the phase mask.

SUMMARY OF THE INVENTION

The present invention is directed to a method of creating a Bragg grating in a photosensitive optical waveguide by irradiating the waveguide with an interference fringe pattern of light generated in the near field of a diffraction grating in a manner that circumvents these high spatial frequency problems.

According to the present invention there is provided a method of creating a Bragg grating in a photosensitive optical waveguide by irradiating the waveguide with an interference fringe pattern generated by the passage of electromagnetic radiation through a diffraction grating located adjacent the waveguide and oriented to have diffracting elements of the grating diffraction extending at an angle to the waveguide axis, wherein, during said creation, the physical spacing between the diffraction grating and the waveguide is modulated.

BRIEF DESCRIPTION OF THE DRAWINGS

There follows a description of the creation of a Bragg grating in a photosensitive single mode optical fibre by a method embodying the invention in a preferred form. Previous reference has already been made to FIGS. 1 to 5 of the accompanying drawings, in which.

Figure 6:
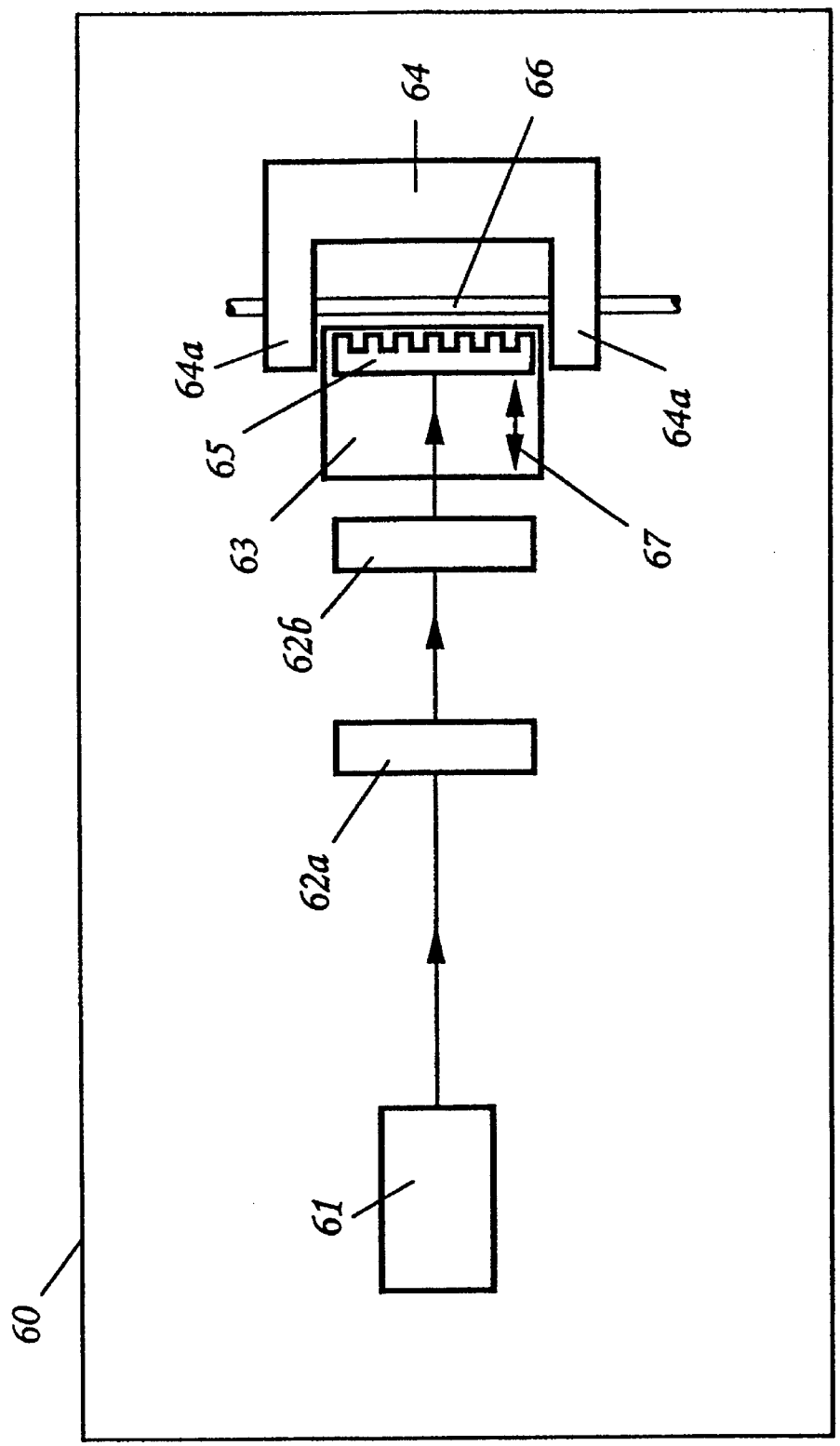

In the ensuing description reference will additionally be made to FIGS. 6, 7 and 8, in which:

FIG. 6 is a schematic diagram of the apparatus employed to create the Bragg grating, FIGS. 7(a) to (f) are plots of the mean near field intensity distribution at incremental distances from a phase grating illuminated at normal incidence, the near intensity distribution being the value averaged over six different values of distance increment ranging from 0 to 50 μm, and FIGS. 8(a) to (f) are plots similar to those of FIG. 7, but in respect of a phase grating with a phase step of 0.9π instead of π.

DETAILED DESCRIPTION OF PREFERRED EMBODIMENTS

Referring to FIG. 6, on a table 60 is secured a laser 61, two cylindrical lenses 62a, 62b, a piezo-electric translation stage 63, and an optical fibre clamping yoke 64. The laser 61 is an argon ion laser providing a frequency doubled output at 244 nm which is directed by the lenses 62a, 62b to be incident substantially normally upon a phase grating 65 mounted on the translation stage 63 to form an area of illumination substantially matched in length to the length of the phase grating 65, and in width to the diameter of an optical fibre 66 extending between the two arms 64a of the fibre clamping yoke 64 so as to lie in close proximity behind the phase grating. The diffracting elements of the phase grating extend in a direction inclined at an angle to that of the axial extent of the optical fibre 66 between the yoke arms 64a. Typically this angle is a right-angle. The piezo-electric translation stage operates to provide controlled translational movement of the grating 65 with respect to the fibre 66 in the direction normal to the plane of the grating (as depicted by arrow-terminated line 67).

To create a Bragg grating in the fibre 66 according to the method of the present invention, the piezo-electric translation stage is operated to ramp the spacing between the fibre 66 and the grating 65 through a certain distance, typically through 50 μm in the case of a phase grating having a grating period of 1.08 μm, while the fibre is illuminated with ultra-violet light from the laser 61 through the grating. The ramping may be on a continuous or stepped basis, and similarly the illumination from the 60 may be continuous or pulsed during the ramping. It should also be evident that relative movement between the grating and the fibre can be effected by using the piezo-electric translation stage to move the yoke 64 instead of using it to move the grating 65.

Figure 1:
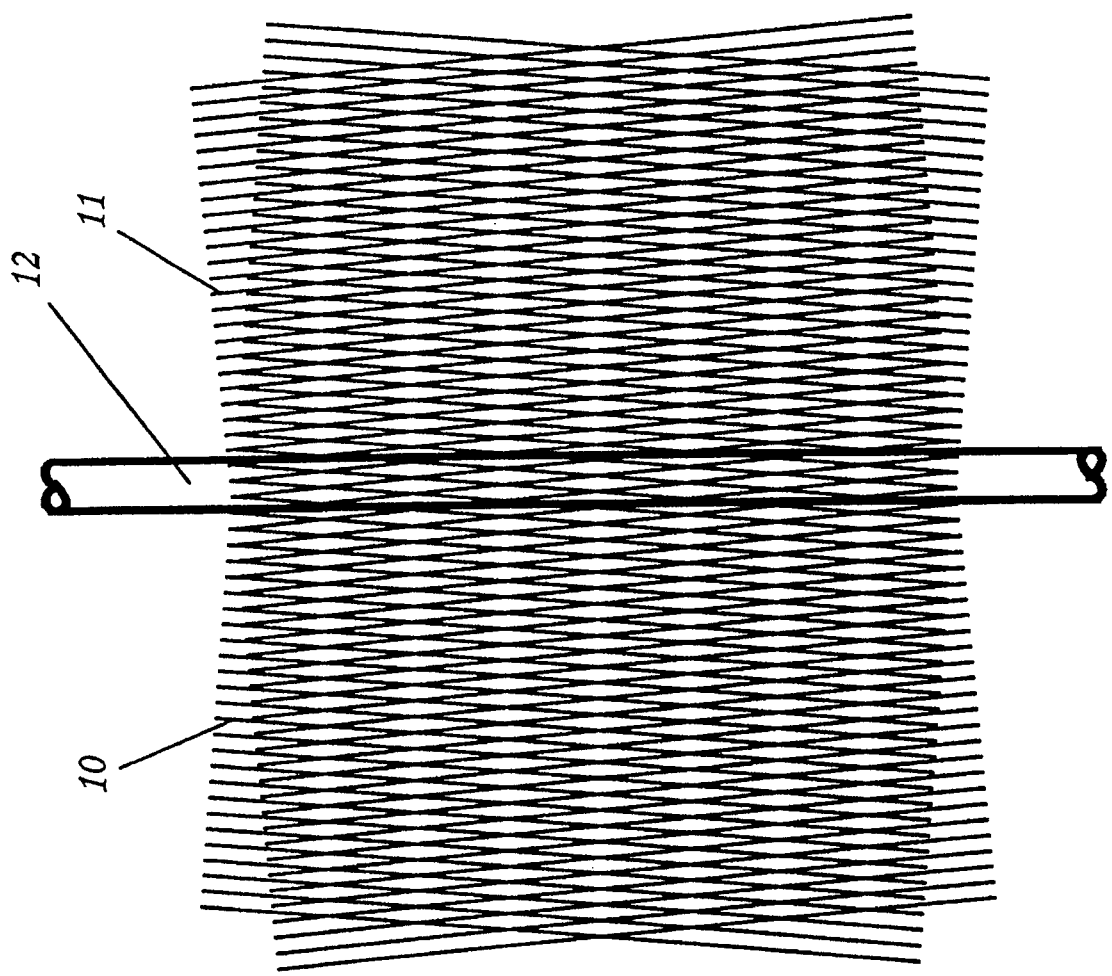
FIG. 1 is a diagram illustrating the generation of a fringe pattern in an optical fibre by two-beam interference.
Figure 2:
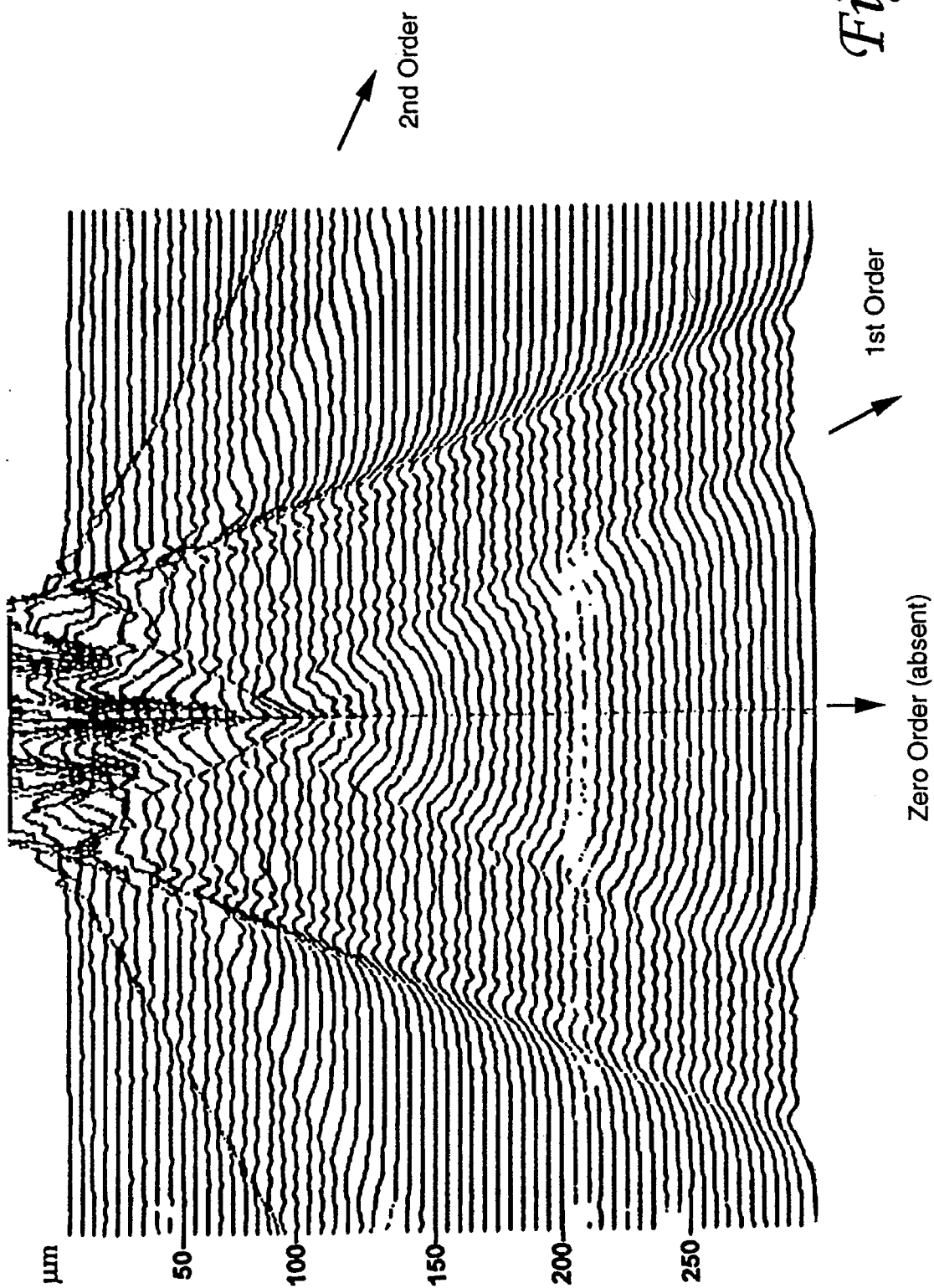
FIG. 2 is a plot of the near field intensity distribution at incremental distances from a short phase grating illuminated at normal incidence.
Figure 3:
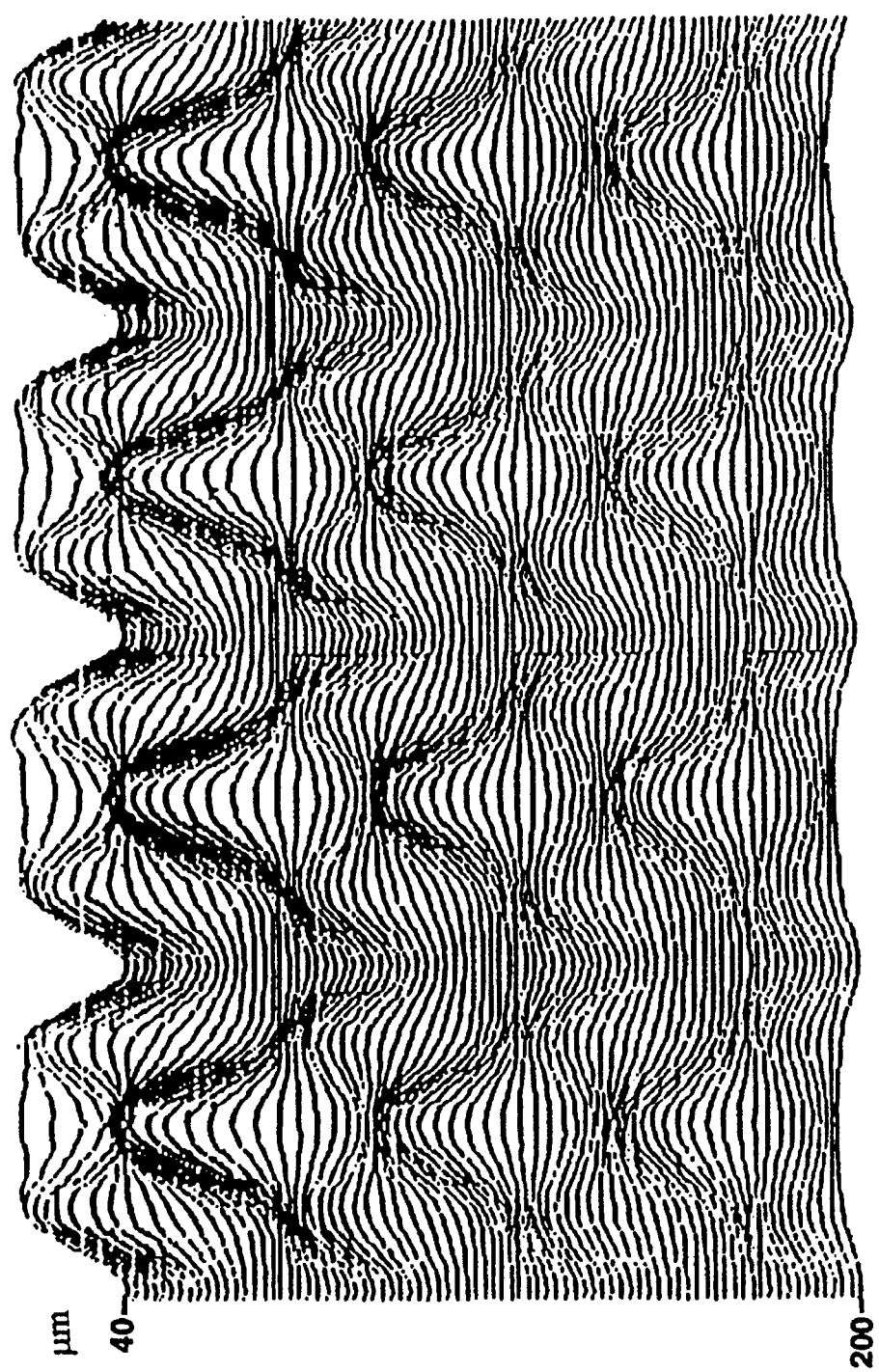
FIG. 3 is a plot similar to that of FIG. 2, but in respect of a longer grating.
Figure 4:
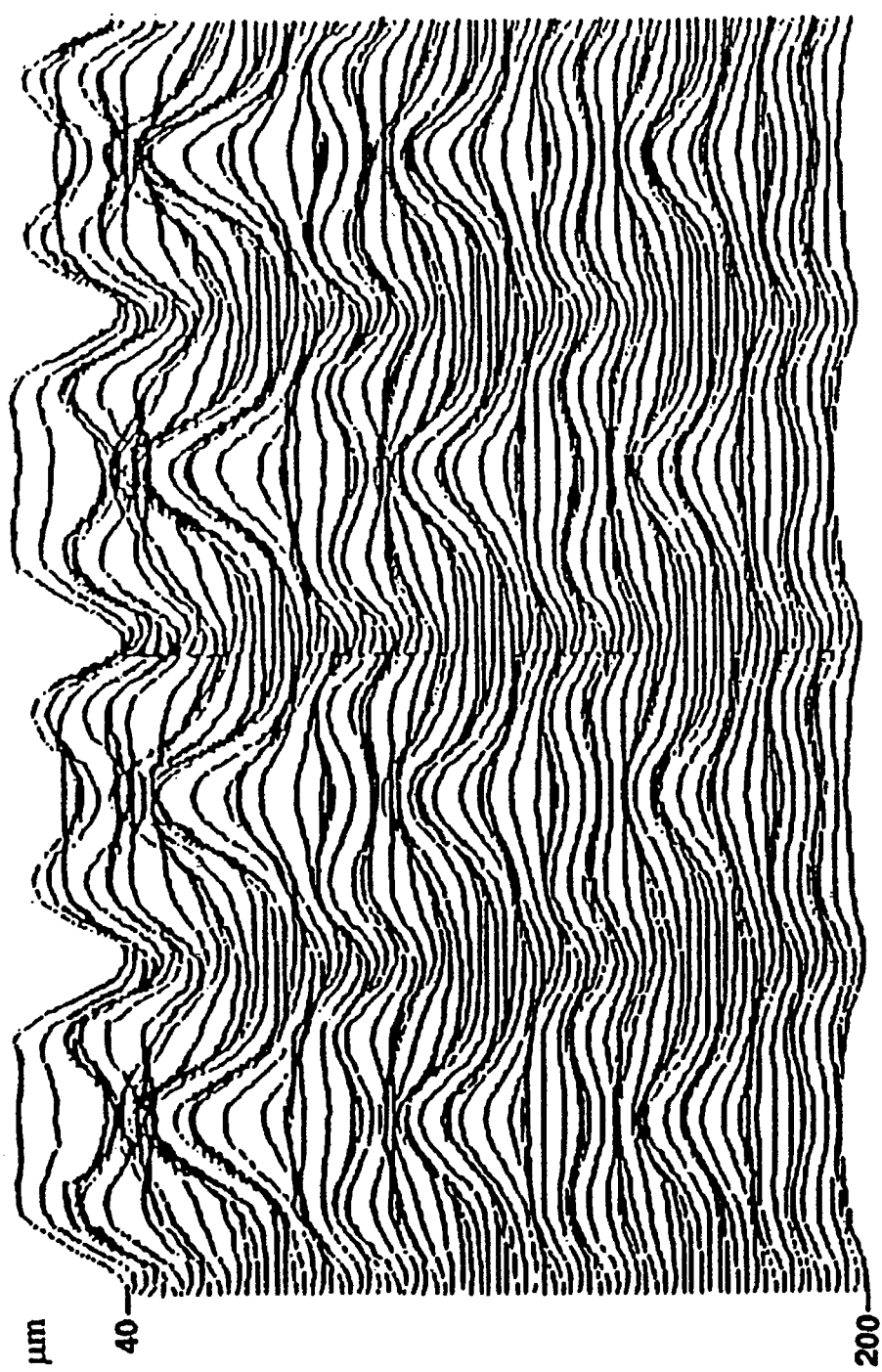
FIG. 4 is a plot similar to that of FIG. 3, but in respect of a phase grating with a phase step of reduced height.
Figure 5:
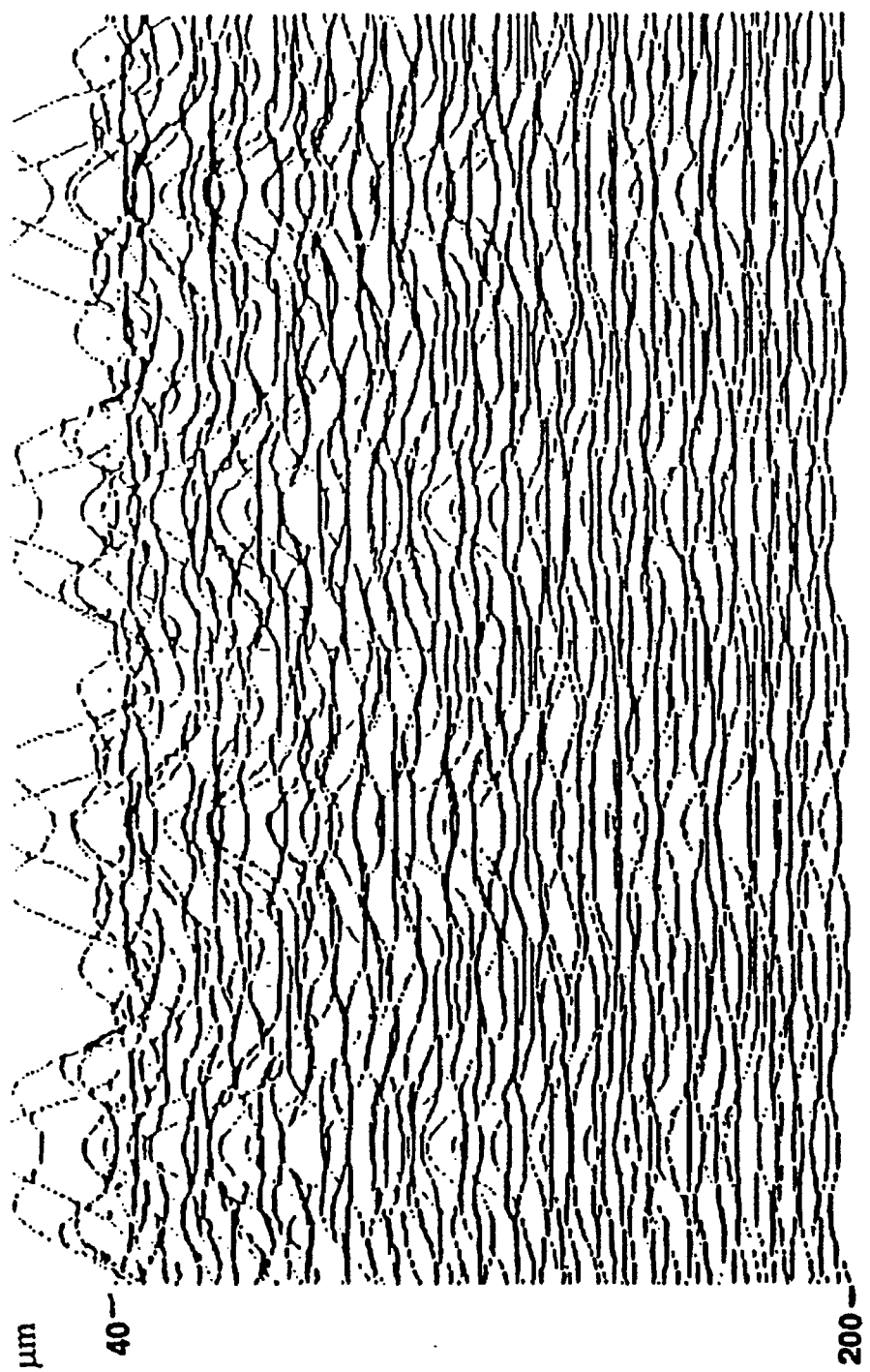
FIG. 5 is a plot similar to that of FIG. 3, but in respect of a phase grating with a different mark to space ratio.
Figure 7A:
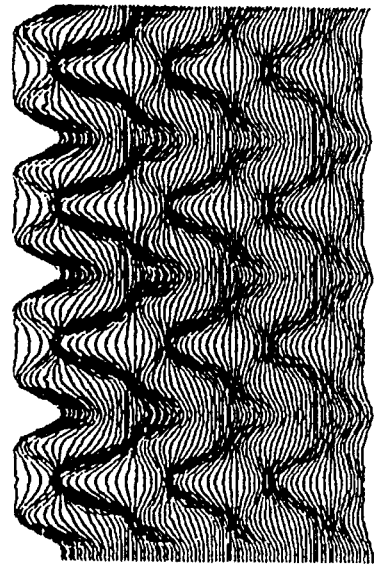
Figure 7B:
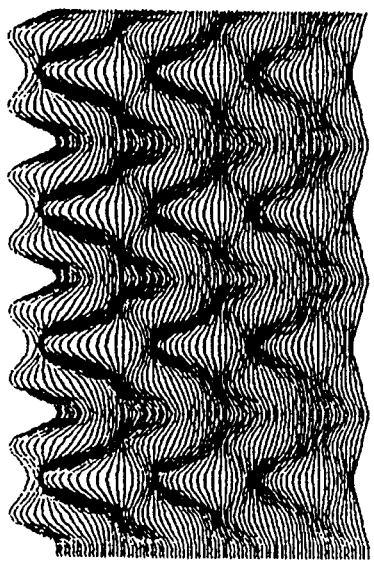
Figure 7C:
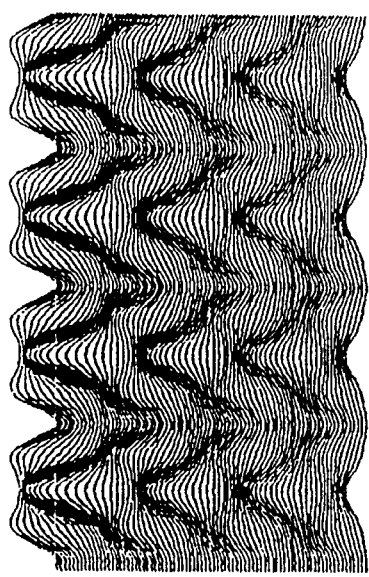
Figure 7D:
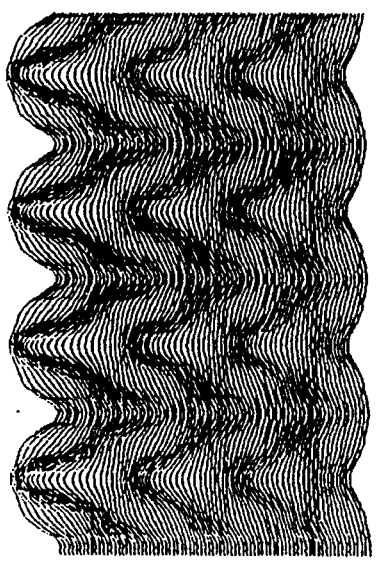
Figure 7E:
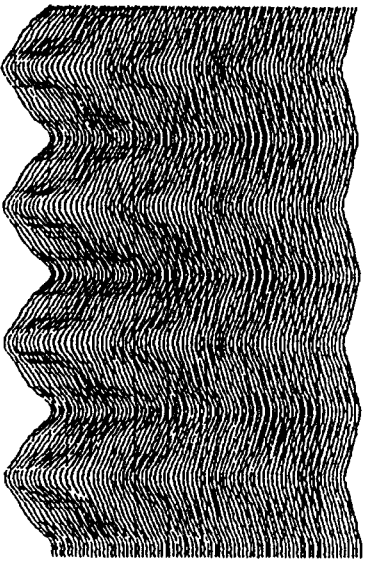

The effect of the relative movement between fibre and phase grating while the Bragg grating is being created may be understood by reference to FIGS. 7(a) to 7(f). Whereas each of the individual lines plotted in FIG. 3 represents the calculated intensity profile at a specific distance from a phase grating (having a phase step of π), each of the corresponding lines plotted in FIG. 7(b) represents the mean of the calculated intensity profile that occurs on steadily ramping through from that specific distance to a distance 10 μm greater. FIGS. 7(c) to 7 (f) are equivalent figures, but with different amplitudes of ramp, respectively 20 μm, 30 μm, 40 μm, and 50 μm. FIG. 7(a) is provided for comparison purposes, its range being zero, and thus this figure is equivalent to FIG. 3.

Inspection of FIG. 3 reveals that its intensity profile plots have a measure of periodicity of about 50 μm in the direction normal to the plane of the grating, while inspection of FIGS. 7(a) to 7(f) reveals that individual mean intensity profile plots exhibit a greatly reduced dependence upon the magnitude of the specific distance of commencement of the ramp. This means that the use of the ramping process in the creation of a Bragg grating in the fibre makes that creation much less sensitive to variations in distance between the grating and the fibre.

Figure 7F:
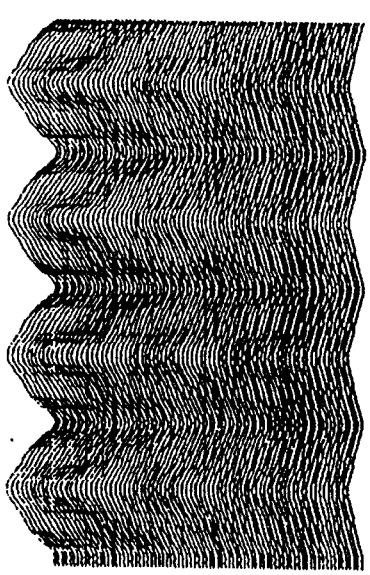
Figure 8C:
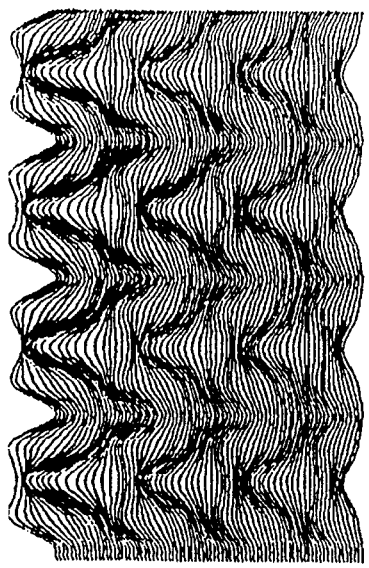
Figure 8F:
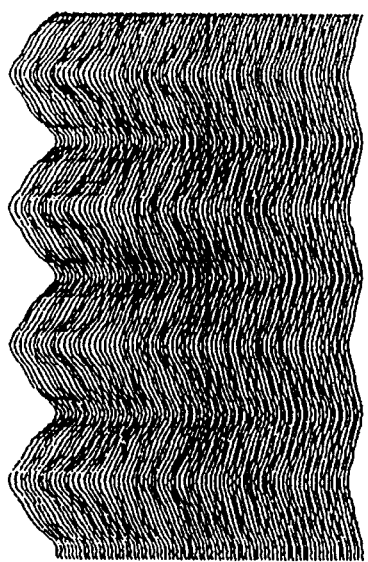
Figure 8B:
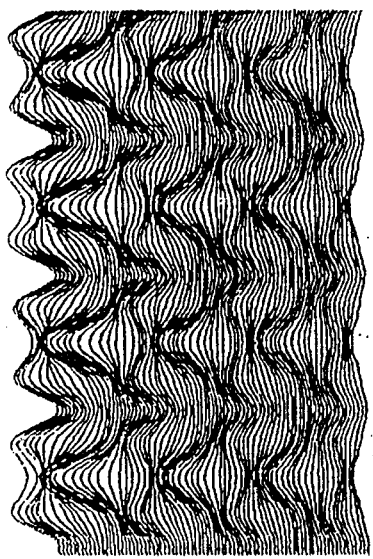
Figure 8E:
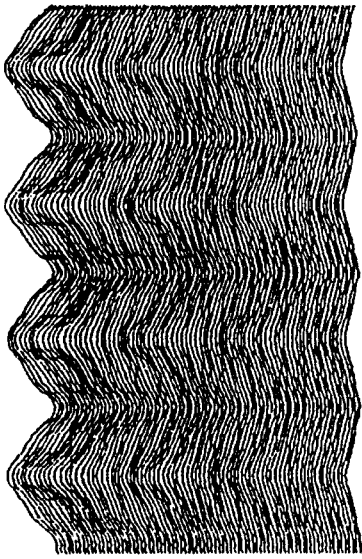
Figure 8A:
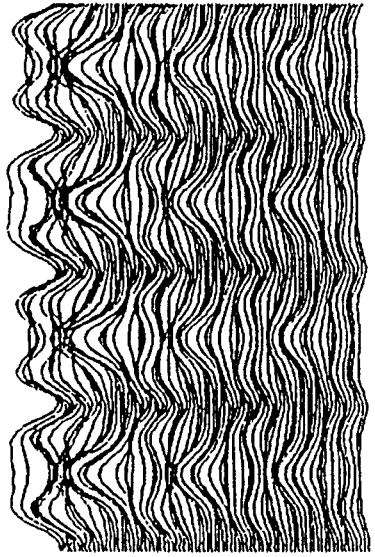
Figure 8D:
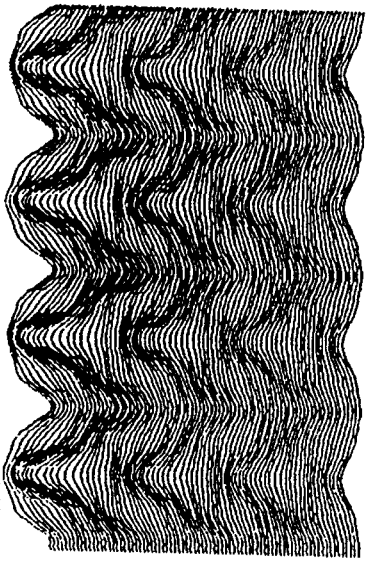

FIGS. 8(a) to 8(f) are mean intensity profile plots respectively corresponding to the plots of FIGS. 7(a) to 7(f), but with the sole difference that the phase step of the grating is reduced by 10% from π to 0.9π. Inspection of these FIGS. 8(a) to 8(f), and comparison with their counterparts, FIGS. 7(a) to 7(f), reveals that the differences between FIGS. 7(f) and 8(f) are much smaller than those between FIGS. 7(a) and 8(a). Accordingly it is seen that the ramping has greatly reduced the sensitivity of Bragg grating creations to errors in phase step of the phase grating employed in the creation of the Bragg grating.

We claim:

1. A method of creating a Bragg grating in a photosensitive optical waveguide by irradiating the waveguide with an interference fringe pattern generated by the passage of electromagnetic radiation through a diffraction grating located adjacent the waveguide and oriented to have diffracting elements of the diffraction grating extending at an angle to the waveguide axis, wherein, during said creation, the physical spacing between the dffraction grating and the waveguide is modulated.

2. A method as claimed in claim 1, wherein said modulation comprises linearly ramping the spacing from a first value to a second value.

3. A method as claimed in claim 2, wherein the difference in spacing between said first and second values is substantially matched with a periodicity, measured normal to the diffraction grating, in the intensity profile exhibited in the near field of the phase grating.

4. A method as claimed in claim 1, wherein said modulation comprises stepping the spacing in equal amplitude steps from a first value to a second value.

5. A method as claimed in claim 4, wherein the difference in spacing between said first and second values is substantially matched with a periodicity, measured normal to the diffraction grating, in the intensity profile exhibited in the near field of the phase grating.

6. A method as claimed in claim 1, wherein the electromagnetic radiation is pulsed during said modulation.

7. A method as claimed in claim 1, wherein the diffracting elements of the diffraction grating extend in a direction substantially at right angles to the waveguide axis.

8. A method as claimed in claim 1, wherein the diffraction grating is a phase grating.

9. An optical waveguide in which a Bragg grating has been created by the method claimed in claim 1.

10. An optical waveguide as claimed in claim 9, which waveguide is a single mode optical fibre.

* * * * *